United States Patent [19]

Aaland

[11] 4,398,156
[45] Aug. 9, 1983

[54] SWITCHING POWER PULSE SYSTEM

[76] Inventor: Kristian Aaland, Livermore, Calif., granted to U.S. Department of Energy under the provisions of 42 U.S.C. 2182

[21] Appl. No.: 205,043

[22] Filed: Nov. 7, 1980

[51] Int. Cl.$^3$ .................. H01J 23/00; H01J 23/34; H05H 7/00
[52] U.S. Cl. .................. 328/233; 315/239; 315/240; 315/244; 331/113 A; 336/172; 328/67
[58] Field of Search ............. 315/239, 240, 237, 244, 315/248; 328/67, 68, 66; 331/113 A; 336/172, 213, 234

[56] References Cited

U.S. PATENT DOCUMENTS

| | | | |
|---|---|---|---|
| 2,491,345 | 12/1949 | Westendorp | 336/172 |
| 2,600,057 | 6/1952 | Kerns | 336/172 |
| 3,134,048 | 5/1964 | Wolfframm et al. | 315/239 X |
| 3,260,976 | 7/1966 | Eissmann | 336/172 |
| 3,337,755 | 8/1967 | Grabowski et al. | 328/67 |
| 3,496,476 | 2/1970 | Farrell | 328/67 |
| 3,586,882 | 6/1971 | Oakes | 328/67 |
| 3,599,017 | 8/1971 | Oakes | 328/67 |
| 3,699,385 | 10/1972 | Paget | 315/239 |
| 3,781,649 | 12/1973 | Ishida | 315/239 |
| 3,914,697 | 10/1975 | Feldmesser | 328/67 |
| 4,099,128 | 7/1978 | Hooper | 328/67 |
| 4,211,957 | 7/1980 | Alley et al. | 315/239 |
| 4,262,233 | 4/1981 | Becker et al. | 315/248 |
| 4,272,692 | 6/1981 | Morse | 328/67 |

Primary Examiner—Saxfield Chatmon, Jr.
Attorney, Agent, or Firm—Clifton E. Clouse, Jr.; Roger S. Gaither; Richard G. Besha

[57] ABSTRACT

A switching system for delivering pulses of power from a source (10) to a load (20) using a storage capacitor (C3) charged through a rectifier (D1, D2), and maintained charged to a reference voltage level by a transistor switch (Q1) and voltage comparator (12). A thyristor (22) is triggered to discharge the storage capacitor through a saturable reactor (18) and fractional turn saturable transformer (16) having a secondary to primary turn ratio N of $n:1/n=n^2$. The saturable reactor (18) functions as a "soaker" while the thyristor reaches saturation, and then switches to a low impedance state. The saturable transformer functions as a switching transformer with high impedance while a load coupling capacitor (C4) charges, and then switches to a low impedance state to dump the charge of the storage capacitor (C3) into the load through the coupling capacitor (C4). The transformer is comprised of a multilayer core (26) having two secondary windings (28, 30) tightly wound and connected in parallel to add their output voltage and reduce output inductance, and a number of single turn windings connected in parallel at nodes (32, 34) for the primary winding, each single turn winding linking a different one of the layers of the multilayer core. The load may be comprised of a resistive beampipe (40) for a linear particle accelerator and capacitance of a pulse forming network (42). To hold off discharge of the capacitance until it is fully charged, a saturable core (44) is provided around the resistive beampipe (40) to isolate the beampipe from the capacitance (42) until it is fully charged.

19 Claims, 5 Drawing Figures

SWITCHING POWER PULSE SYSTEM

ORIGIN OF THE INVENTION

The invention described herein resulted from Contract W-7405-ENG-48 between the United States Department of Energy and the University of California.

BACKGROUND OF THE INVENTION

This invention relates to a system for switching high power pulses into a load, such as a pulsed linear particle accelerator, using a saturable transformer, and further relates to a structure for the saturable transformer.

Many pulse power applications, such as a pulsed linear accelerator or a copper vapor laser for isotope separation, require both reliability and high repetition rates. Usually a pulse forming network, or just a capacitor, is charged to a selected voltage, and maintained charged until a power pulse is to be delivered to a load. An electric switch in series with the load is used to connect the storage network to the load. Electric switches that under certain conditions have been used reliably include triggered spark gaps, ignitrons and thyratrons. These switches isolate very well in the open state so the storage network can be fully charged without leakage, and held charged a long time before activation of the switch. A saturable transformer can also be used as a switch with low leakage current in such a switching system. Such a saturable transformer may be provided with a step-up turn ratio to produce a high output voltage. The resultant magnetic switching can provide the high repetition rates usually required, and the system becomes both economical and reliable because it utilizes just a saturable transformer. It does not require a control terminal (grid or other control electrode) as in other electric switches.

As just noted above, a high step-up turn ratio is often desired in the power pulse switching transformer. However, the inductance of the secondary winding is proportional to the square of the number of turns in the secondary winding and must be kept as small as possible; consequently the number of primary turns must be made as small as possible. This suggests a switching transformer having fractional turns in the primary winding in order to produce a high step-up ratio with a small output inductance. For instance, if the transformer is made with a small number n of turns in the secondary winding, such as 8, and a fractional turn 1/n in the primary winding, the output voltage is stepped up by the ratio n:1/n which is equal to $n^2$. A fractional turn is a turn that links only part of the total flux, i.e., links only a fraction of the core linked by turns of the other winding.

OBJECTS AND SUMMARY OF THE INVENTION

An object of this invention is to provide a switching system for delivering pulses of power from an ac source to a load.

Another object is to provide a circuit for charging a capacitor during half or less of a cycle of an ac source, or alternatively a number of cycles, and holding a specified voltage in the capacitor until a switch is closed to discharge the capacitor into a load.

Still another object is to provide a switching transformer having a fractional turn in one winding and a desired number of turns in the other winding.

Yet another object is to pulse a resistive beam pipe of a linear accelerator using a saturable core switch.

These and other objects of the invention are achieved in a circuit for charging a capacitor from an ac source, where the capacitor is connected in series with an electronic regulator means in the charging current path comprised of an electronic switch and means for maintaining the electronic switch in a saturated conducting state at all times while the voltage across the capacitor is below a predetermined reference level. Once the capacitor is charged, the same regulator goes into an analog mode and the capacitor voltage is maintained without power loss until an electronic switching means connects the capacitor to a load. The electronic switching means is preferably comprised of a trigger switch in series with a saturable transformer, and in the case of a thyristor for the trigger switch, a saturable reactor may be included in series to prevent switching the saturable transformer until the thyristor is turned on to saturation.

In accordance with one feature of the invention, the saturable transformer is provided with a fractional turn in the primary winding, and multiple turns in the secondary winding, for a high step-up turn ratio without high inductance in the secondary winding. The fractional turn winding is provided by a core having n layered and closed magnetic flux paths, and a separate single turn winding around each layer connected in parallel to form a fractional (1/n) primary winding. The secondary winding is wound on the core with a number of turns tight around all layers of the core at points between the single turn windings of the fractional primary where the cross sectional area of the core is a minimum. This minimizes secondary inductance. A high ratio of the secondary winding turns, n, to the fractional primary winding turns, 1/n, which is $n^2$, is provided for a high step-up voltage ratio to enhance voltage holding, and to further reduce inductance in the secondary winding, the secondary winding is divided into a plurality of windings so connected in parallel that their inductances are reduced at the cost of some step-up raio. In that manner, a capacitor is charged to a desired level, and then connected to a load for discharge using an electronic trigger switch and a saturable transformer in series. A saturable reactor is connected in series between the trigger switch and saturable transformer, if required to hold off the stored energy until the electronic switch is turned on fully before switching the saturable transformer.

The load may be comprised of a resistive beampipe, or column, for a linear particle accelerator and capacitance, such as the capacitance of a pulse forming network. To hold off discharge of the capacitance until it is fully charged, a saturable core is provided around the resistive beampipe to isolate the beampipe from the capacitance until it is fully charged. Once the core saturates, the full voltage is applied along the resistive beampipe.

The novel features that are considered characteristic of this invention are set forth with particularity in the appended claims. The invention will best be understood from the following description when read in connection with the accompanying drawings.

Reference will now be made in detail to preferred embodiments of the invention illustrated in the accompanying drawings.

DESCRIPTION OF PREFERRED EMBODIMENTS

Figure 1:
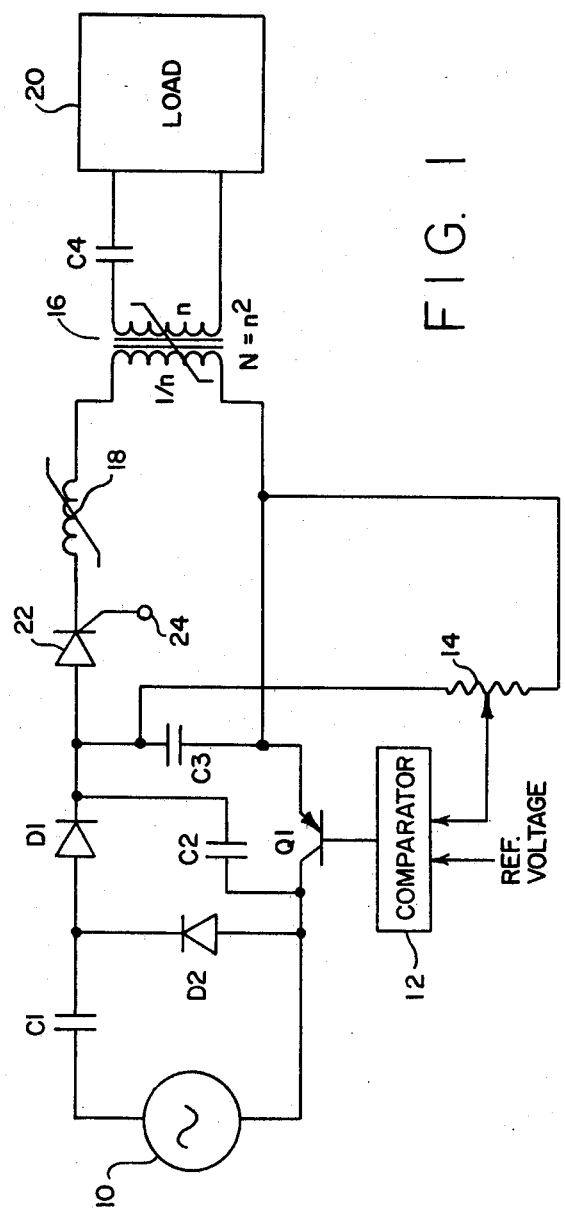
FIG. 1 illustrates a circuit diagram of a system for charging a capacitor from an ac source and discharging it into a load in response to a trigger input pulse using a saturable transformer.

Referring now to FIG. 1, an ac source 10 of selected high frequency, such as 10 kHz, is coupled by a capacitor C1 to a half-wave rectifier comprised of two diodes D1 and D2. A filter capacitor C2 may be connected at the output of the diode rectifier, but it should be so small as to leave positive half cycles on the line for resonance charging a capacitor C3 to a reference voltage level in either a fraction of a cycle, or in a number of cycles, depending upon whether the capacitor C1 is much greater than capacitor C3, or not. The first charging mode is the applicable one when capacitor C1 is larger. The second charging mode is the one that necessarily applies if the capacitor C3 is larger.

For the return current path to the source while charging the capacitor C3, a transistor Q1 is held conducting by a comparator 12 which receives a voltage signal from a voltage dividing potentiometer 14 connected across the capacitor C3, and also receives a reference voltage. The comparator 12 turns the transistor Q1 on whenever a fraction of the voltage sensed across the capacitor is less than the reference. The fraction of the voltage across the capacitor to be compared is set by the potentiometer.

The return current path for the charging capacitor is through the primary winding of a saturable transformer 16 and a saturable reactor 18. Once the capacitor C3 has been charged, the comparator 12 turns off the transistor Q1 so that the return current path is cut off, thereby terminating the charging process at any point of any cycle of the source. At any time that the charge on the capacitor drops below the desired level, the comparator turns the transistor Q1 on again, thereby to resume charging. This comparator will thus function as a regulator to maintain the capacitor charged at the desired level.

When it is time to discharge the capacitor C3 into a load 20 through a storage capacitor C4, a thyristor 22 connecting the capacitor to the saturable reactor 18 is triggered on by a pulse of current at a terminal 24. The thyristor by itself will require a finite time (microseconds) to turn on fully, thus limiting the current turn-on to about 100 A/s. To achieve much higher thyristor turn-on currents of about 2,000 amperes, the saturable reactor is included in series. It functions as an electronic switch to restrict discharge of the capacitor C3 until the thyristor is in saturation. At that time the saturable reactor will also be in saturation, and thus switched to its low impedance state. In that manner, the saturable reactor functions as a "soaker" while the thyristor is being turned on to saturation. The saturable transformer 16 steps up voltage, charging the storage capacitor C4.

When the transformer saturates, switching occurs, i.e., high secondary current flows, and the capacitor C4 discharges into the load. The design of a switching transformer which provides the necessary step-up voltage, while at the same time limits the inductance of the secondary winding, is shown in FIGS. 2, 3 and 4.

Figure 2:
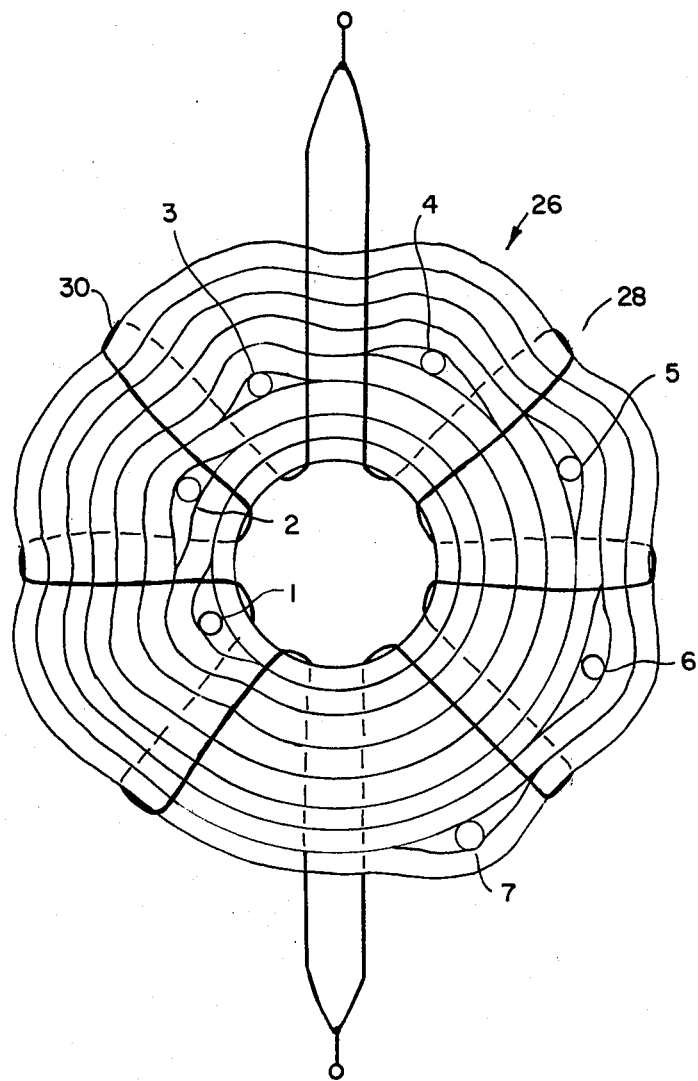
FIG. 2 is a plan view of a transformer having a fractional turn primary winding and a multiple turn secondary winding.
Figure 3:
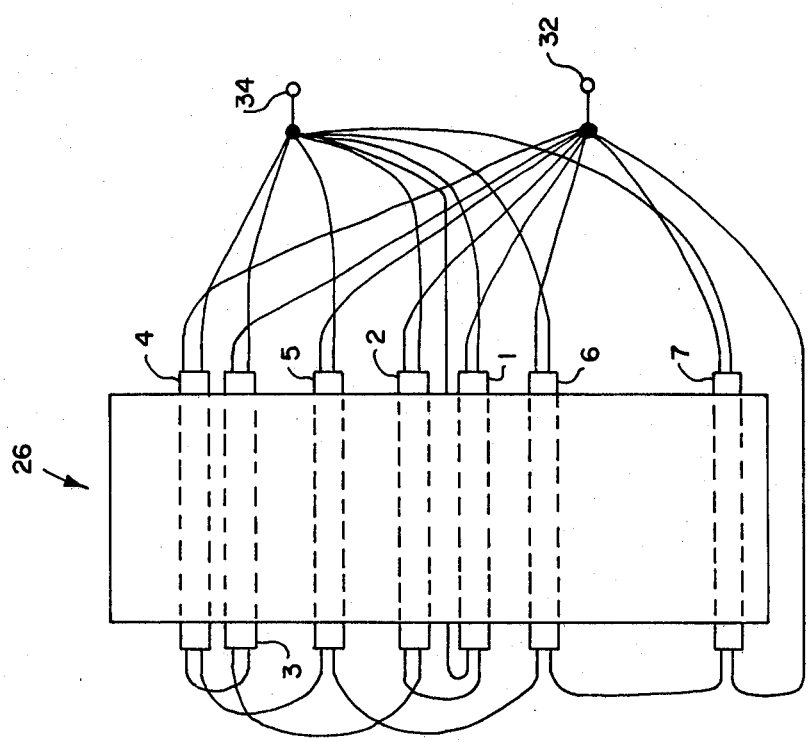
FIG. 3 is a side view of the transformer shown in FIG. 2.

Referring now to FIG. 2, a plan view of the transformer shows that it is comprised of a layered toroidal core 26, two secondary windings 28, 30 in parallel, each having four turns, and a plurality of single turn primary windings through tubes 1-7. The single turn windings (not shown in FIG. 2) are connected in parallel (as shown in FIGS. 3 and 4), each winding linking a separate layer of the core. In practice, the core is constructed from a ribbon of amorphic material, such as $Fe_{80}B_{20}$, which exhibits high saturation flux and low magnetic losses. The first (inner) layer of the core is formed by tightly winding several turns of ribbon. Then tube 1 is put in place, and the second layer is formed, again by winding several turns of the ribbon. Tube 2 is next put in place and the third layer is formed, and so forth, until all tubes are in place between successive layers. Alternative arrangements for the layers of core material could be provided. For example, instead of placing them all in one plane, thus causing each layer to be of greater diameter, all layers may be separate hoops of the same diameter, stacked side by side after a single turn winding is provided on each.

Once the core has thus been constructed, the secondary windings 28 and 30 are tightly wound as shown, passing the turns over those portions of the core where the layers are the tightest against each other. Then the primary winding is added as a plurality of parallel single turns, one linking each layer separately, with all of the turns loosely wound and their ends connected to nodes 32 and 34 as shown in FIG. 3. The first single turn passes from node 32 through the center of the toroidal core and back to node 34 through tube 1. The second single turn passes from the node 32 through tube 1 and back to node 34 through tube 2. The third single turn passes from the node 32 through tube 2 and back to node 34 through tube 3. The procedure is continued, using all the tubes, until the last (eighth) single turn is put in place. It passes from the node 32 through tube 7 and back to node 34 around the outside of the core.

Figure 4:
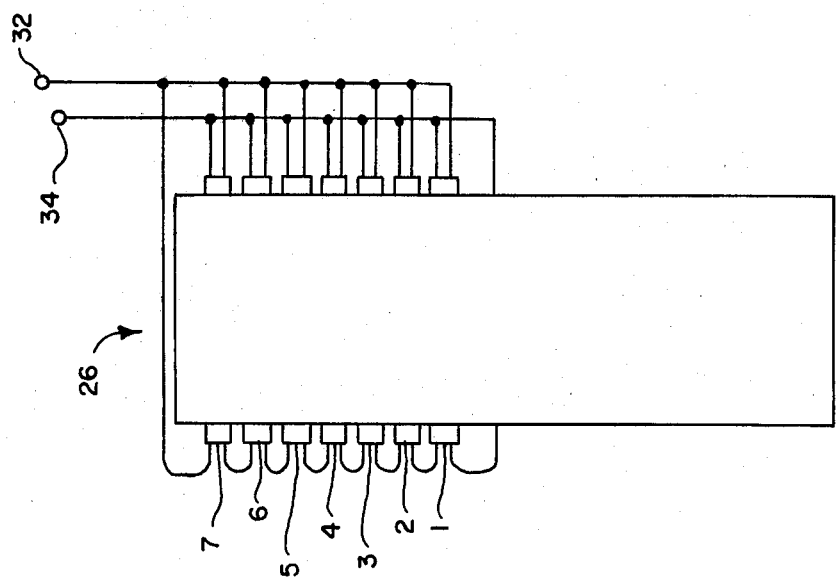
FIG. 4 is a modified representation of the side view of FIG. 3.

To better understand this arrangement for the parallel single turn windings, reference is made to FIG. 4 which shows schematically all of the tubes 1 through 7 positioned directly above each other between layers of the core. This more orderly schematic arrangement makes clear how each turn passes around only one layer, how the tubes are used for passage of the single turn winding for each layer from one side of the core to the other and back again, and how the turns are connected in parallel. Since each of the single turn windings links only a fraction ($\frac{1}{8}$) of the total flux path, while the secondary windings 23 and 24 link all of the flux path, the ratio of the secondary turns, n=8, to the primary turns, $1/n = \frac{1}{8}$, is thus $n^2 = 64$. The result is substantial voltage step-up with only eight turns in the secondary winding. In that manner, a fractional turn primary winding produces a high step-up ratio with a small secondary winding inductance. In practice, to enhance voltage holding and to further reduce the secondary inductance, the eight turns of the secondary winding are divided evenly into two parallel windings 28 and 30 with four turns in each so that their combined inductance is reduced to $\frac{1}{4}$ while their voltage is reduced to $\frac{1}{2}$, thus further reducing secondary inductance at a cost of only some voltage step up, achieving best voltage holding capability.

Figure 5:
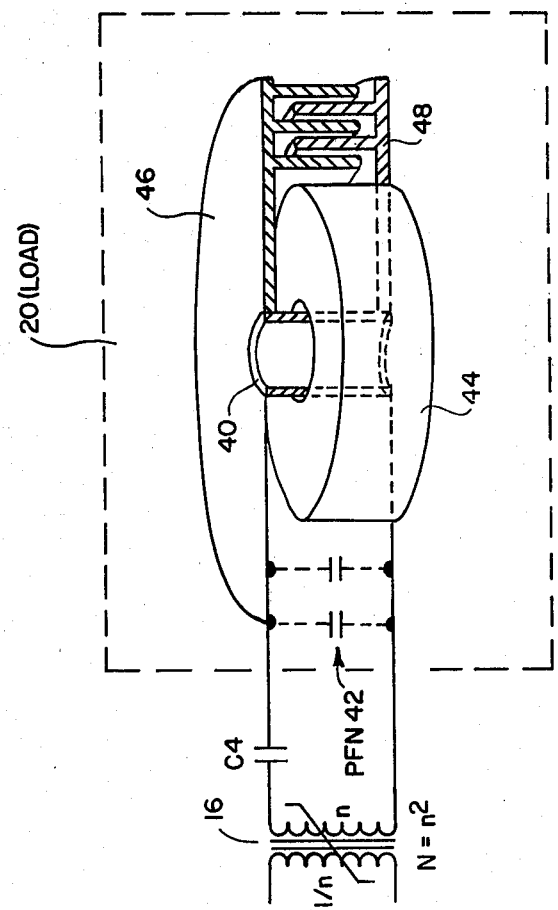
FIG. 5 illustrates schematically a particular arrangement for magnetically switching a pulse forming network in the load of FIG. 1 directly into a resistive beampipe of a linear accelerator.

Referring now to FIG. 5, a particular load which may be used to advantage with the circuit of FIG. 1 is a linear particle accelerator in which a resistive beampipe 40 is connected to the storage capacitor C4 and transformer 16 through a pulse forming network (PFN) 42 of capacitance equal to that of the storage capacitor C4. To prevent the capacitance of the PFN from discharging as the capacitor C4 proceeds to transfer its charge into it, a saturable core 44 is placed close around the beampipe. In operation, the capacitor C3 (FIG. 1) is charged at the desired repetition rate by a generator. The capacitor C4 is resonance charged through the primary leakage inductance of the transformer 16 which provides excellent voltage isolation. The transformer "switches" (saturates) when the capacitor C4 has reached its peak voltage, and the pulse forming network 42 is rapidly charged through the secondary winding of the transformer which then has low impedance (saturated inductance). The saturable core 44 isolates the beampipe 40 during this charging of the pulse forming network. Once the pulse forming network is fully charged, the core 44 "switches" (saturates) to apply the full voltage of the pulse forming network to the resistive beampipe 40. It should be noted that if consecutive pulses are to be applied to the load, they must alternate in polarity. For unidirectional polarity pulses, the saturable cores and the switching (saturable) transformer must be reset.

The beampipe may be provided with flanges 46 and 48, as shown half cut away in FIG. 5, to provide the pulse forming network and connect it to the beampipe. The capacitance of the PFN shown schematically on the left of the beampipe may be formed as annular plates extending from the inside surfaces of the flanges 46 and 48, as shown on the right of the beampipe. In practice, sections of the arrangement shown in FIG. 5 may be stacked to provide additional beampipe for more acceleration. As an example, one section with a load impedance of 1 ohm may be provided with 10 kV and 10 kA pulses. For a short pulse length of 10 nsec, a capacitance for the pulse forming network of 5 nF is required. The pulse forming network must be charged with 20 kV (because of the source impedance adding to the load in series). This requires energy of 1 joule per pulse. For a charging time of 100 nsec, a core area of 3.3 sq. cm (e.g., a cross section of 1 cm by 3.3 cm) is required. The rise time is 1 nsec.

It is thus evident that the present invention provides a magnetic switching system for charging a storage capacitor, and a magnetic switch for preventing a pulse forming network from discharging until it is fully charged. The magnetic switching at each stage is designed to hold until it is time to switch, and then to automatically switch from a high to a low impedance state. This magnetic switching characteristic can be readily controlled in production by the selection of material and the design of the size and slope of the saturable cores in these magnetic switches.

Although particular embodiments of the invention have been described and illustrated herein, it is recognized that modifications and variations may readily occur to those skilled in the art. For example, omitting the electronic trigger switch (thyristor) 22, and enlarging the magnetic switch 18, the system works to produce a continuous output of pulses, provided the input to the capacitor C3 alternates in polarity, or the magnetic switches (reactor 18 and switching transformer 16) are reset after each pulse. In either case, all pulses are precisely controlled, making the system especially attractive for controlled repetition rate and burst operation. The system circumvents the use of a linear charging inductance, the bulkiest components in conventional systems. Consequently, it is intended that the claims be interpreted to cover such modifications and equivalents.

What is claimed is:

1. A pulse forming system for a resistive beampipe for a linear accelerator, said system including a circuit for charging a capacitor from an ac source in order to produce a high power pulse into said beampipe, said system comprising
    an electronic regulator means connected in series with the source and a capacitor for maintaining charging current at all time while voltage across the capacitor is below a predetermined reference level, and
    switching means connecting said capacitor to said beampipe for producing therein a high power pulse, said switching means comprising a switching transformer,
    said switching transformer being comprised of: a core having layers of core material; a number of single turn windings, one for each layer linking only the flux of one layer, said single turn windings being connected in parallel to form a fractional primary winding, where the fraction is equal to that fraction of the total flux linked by just one of said single turn windings; and a secondary winding linking all of said layers with a number of turns,
    a capacitance connected in parallel with said beampipe and across said transformer, and
    a saturable core surrounding said resistive beampipe to isolate the beampipe from said capacitance until said capacitance is fully charged from said transformer, whereupon said saturable core saturates and said pulse is applied to said beampipe.

2. A circuit as defined in claim 1 wherein said switching means further includes a saturable reactor in series between said capacitor and switching transformer.

3. A circuit as defined in claim 2 wherein said switching means further includes an electronic switching means connected in series between said saturable reactor and said capacitor.

4. A circuit as defined in claim 3 wherein said electronic switching means is a thyristor.

5. A circuit as defined in claim 1, 2 or 3, wherein said regulator means is comprised of an electronic switch and means for maintaining said electronic switch in a saturated conducting state while the voltage across said capacitor is below a reference level, and at all other times, conducting at a significantly lower level sufficient to just maintain said capacitor charged to said reference level.

6. The pulse forming system of claim 1, wherein said capacitance connected in parallel with said beampipe includes a first flange extending transversely from one end of said beampipe and a second flange extending transversely from the other end of said beampipe, a first set of spaced apart annular plates extending from said first flange, and a second set of spaced apart annular plates extending from said second flange, said second set of plates being interleaved with and spaced from said first set of plates.

7. The transformer of claim 1, wherein said core material is $Fe_{80}B_{20}$.

8. The transformer of claim 1, wherein said core is constructed from a ribbon of $Fe_{80}B_{20}$.

9. A pulse forming system for a resistive beampipe for a linear accelerator, said system including means for delivering pulses of power from an ac source to said beampipe, said system comprising
a storage capacitor having two terminals,
rectifying means coupling said ac source to one terminal of said capacitor for charging said capacitor,
means including an electronic switch for coupling the second terminal of said capacitor to said ac source for return current as said capacitor is charged, said electronic switch having a control input terminal for switching conduction therethrough between high conduction and no conduction in response to a control signal,
means for sensing the charge voltage of said capacitor and producing a voltage signal proportional thereto,
means for comparing said voltage signal with a reference voltage, and for producing said control signal to switch said electronic switch from high conduction to no conduction when the voltage signal equals said reference signal, and from no conduction to high conduction when the voltage signal is less than said reference signal, thereby to maintain said capacitor charged until it is to be discharged through said beampipe, and
switching means for coupling said capacitor to said load for discharge of said capacitor into said load in response to a trigger input pulse,
wherein said switching means is comprised of an electronic discharge switch means and a saturable transformer, said electronic discharge switch means being connected in series with the primary winding of said transformer, and
wherein said saturable transformer is comprised of: a core having layers of core material; a number of single turn windings, one for each layer linking only the flux of one layer, said single turn windings being connected in parallel to form a fractional primary winding, where the fraction is equal to that fraction of the total flux linked by just one of said single turn windings; and a secondary winding linking all of said layers with a number of turns,
a capacitance connected in parallel with said beampipe and across said transformer, and
a saturable core surrounding said resistive beampipe to isolate the beampipe from said capacitance until said capacitance is fully charged from said transformer, whereupon said saturable core saturates and said pulse is applied to said beampipe.

10. A switching system as defined in claim 9 wherein said saturable transformer is a voltage step-up transformer having a saturable core.

11. A switching system as defined in claim 10 including a capacitor coupling said secondary winding to said load.

12. A switching system as defined in claim 11 wherein said electronic discharge switch means is comprised of an electronic switch requiring a finite time to reach saturation upon being switched from no conduction to high conduction, and a saturable reactor in series, whereby said saturable reactor will remain in a high impedance state while said electronic switch is reaching saturation and then switched to a low impedance state for rapid discharge of said storage capacitor into said saturable transformer.

13. A switching system as defined in claim 10 wherein said number of turns of said secondary winding are provided in a plurality of parallel windings of equal turns, said parallel windings being connected to add their induced voltages, whereby the total inductance of said secondary winding is decreased by a factor equal to the number of parallel secondary windings.

14. A switching system as defined in claim 13 wherein said core layers form a closed multilayer flux path.

15. A switching system as defined in claim 14 wherein said closed multilayer flux path is formed by concentric toroidal layers.

16. The transformer of claim 9, wherein said core material is amorphic material exhibiting high saturation flux and low magnetic losses.

17. The transformer of claim 9, wherein said core material is $Fe_{80}B_{20}$.

18. The transformer of claim 9, wherein said core is constructed from a ribbon of $Fe_{80}B_{20}$.

19. The pulse forming system of claim 9, wherein said capacitance connected in parallel with said beampipe includes a first flange extending transversely from one end of said beampipe and a second flange extending transversely from the other end of said beampipe, a first set of spaced apart annular plates extending from said first flange, and a second set of spaced apart annular plates extending from said second flange, said second set of plates being interleaved with and spaced from said first set of plates.

* * * * *